US012648390B2

(12) United States Patent
Osada et al.

(10) Patent No.: US 12,648,390 B2
(45) Date of Patent: Jun. 2, 2026

(54) LIQUID SUPPLY DEVICE, LIQUID SUPPLY METHOD, AND STORAGE MEDIUM

(71) Applicant: Tokyo Electron Limited, Tokyo (JP)

(72) Inventors: So Osada, Kikuchi-gun (JP); Katsuya Okuda, Kumamoto (JP); Naohiro Iwanaga, Koshi City (JP); Kazuki Kosai, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 48 days.

(21) Appl. No.: 18/917,045

(22) Filed: Oct. 16, 2024

(65) Prior Publication Data

US 2025/0132171 A1 Apr. 24, 2025

(30) Foreign Application Priority Data

Oct. 23, 2023 (JP) ................................. 2023-181915

(51) Int. Cl.
*H01L 21/67* (2006.01)
(52) U.S. Cl.
CPC .. *H01L 21/67023* (2013.01); *H01L 21/67253* (2013.01)
(58) Field of Classification Search
CPC ......... H01L 21/67023; H01L 21/67253; H01L 21/67017; H01L 21/67501; F17D 1/04; F17D 1/18; F17D 1/01
See application file for complete search history.

(56) References Cited

U.S. PATENT DOCUMENTS

| | | | |
|---|---|---|---|
| 11,569,086 B2 * | 1/2023 | Kosai | ................ H01L 21/02052 |
| 11,687,102 B2 * | 6/2023 | Chen | ................ H01L 21/67086 |
| | | | 137/88 |

FOREIGN PATENT DOCUMENTS

| | | | |
|---|---|---|---|
| JP | 2021-009956 A | 1/2021 | |
| KR | 20220027980 A * | 3/2022 | ....... H01L 21/67051 |

OTHER PUBLICATIONS

KR20220027980A machine translation (Year: 2022).*

* cited by examiner

*Primary Examiner* — Michael R Reid
(74) *Attorney, Agent, or Firm* — Armstrong Teasdale LLP

(57) ABSTRACT

A liquid supply device includes a tank storing a processing liquid, a circulation line, a pump, and a supply line for supplying the processing liquid to a liquid processor. The circulation line includes a main line, and first and second branch lines branching from the main line. The supply line includes first and second supply lines connected to the first and second branch lines, respectively. The first and second branch lines includes first and second heating mechanisms, first and second filters, first and second drain lines for draining the processing liquid, first and second branch circulation lines for returning the processing liquid to the tank, and first and second valves provided to switch a destination of the processing liquid, respectively.

10 Claims, 7 Drawing Sheets

LIQUID SUPPLY DEVICE, LIQUID SUPPLY METHOD, AND STORAGE MEDIUM

CROSS-REFERENCE TO RELATED APPLICATION

This application is based upon and claims the benefit of priority from Japanese Patent Application No. 2023-181915, filed on Oct. 23, 2023, the entire contents of which are incorporated herein by reference.

TECHNICAL FIELD

The present disclosure relates to a liquid supply device, a liquid supply method, and a non-transitory computer-readable storage medium.

BACKGROUND

In the related art, there is known a liquid processing apparatus which circulates a processing liquid for a substrate such as a semiconductor wafer (hereinafter also referred to as a wafer) through a circulation line and supplies the processing liquid to a liquid processor via a branch line branched from the circulation line. The circulation line of the liquid processing apparatus is provided with a filter module (hereinafter also referred to as a filter) which removes foreign substances from the processing liquid, and a temperature adjuster which adjusts a temperature of the processing liquid flowing through the circulation line.

PRIOR ART DOCUMENT

Patent Document

Patent Document 1: Japanese Laid-Open Patent Publication No. 2021-009956

SUMMARY

According to one embodiment of the present disclosure, a liquid supply device includes a tank configured to store a processing liquid, a circulation line configured to return the processing liquid sent from the tank to the tank, a pump provided in the circulation line, and a supply line connected to the circulation line and configured to supply the processing liquid to a liquid processor for performing liquid processing on a substrate, wherein the circulation line includes a main line in which the pump is provided, and includes a first branch line and a second branch line branching from the main line, and the supply line includes a first supply line connected to the first branch line and a second supply line connected to the second branch line. The first branch line includes a first heating mechanism, a first filter, and a first drain line configured to drain the processing liquid flowing through the first branch line, which are arranged sequentially from an upstream side. The first branch line further includes a first branch circulation line branching from between the first heating mechanism and the first filter to return the processing liquid sent from the tank to the tank, and includes a first valve provided between the first drain line and the first branch line to switch a destination of the processing liquid. The second branch line includes a second heating mechanism, a second filter, and a second drain line configured to drain the processing liquid flowing through the second branch line, which are arranged sequentially from an upstream side. The second branch line further includes a second branch circulation line branching from between the second heating mechanism and the second filter to return the processing liquid sent from the tank to the tank, and includes a second valve provided between the second drain line and the second branch line to switch a destination of the processing liquid.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a diagram showing a schematic configuration of a processing liquid source according to an embodiment.

FIG. 5 is a schematic diagram showing an example of an operation of the processing liquid source according to the first embodiment.

FIG. 6 is a schematic diagram showing an example of an operation of the processing liquid source according to the first embodiment.

FIG. 7 is a schematic diagram showing an example of an operation of the processing liquid source according to the first embodiment.

DETAILED DESCRIPTION

Figure 1:
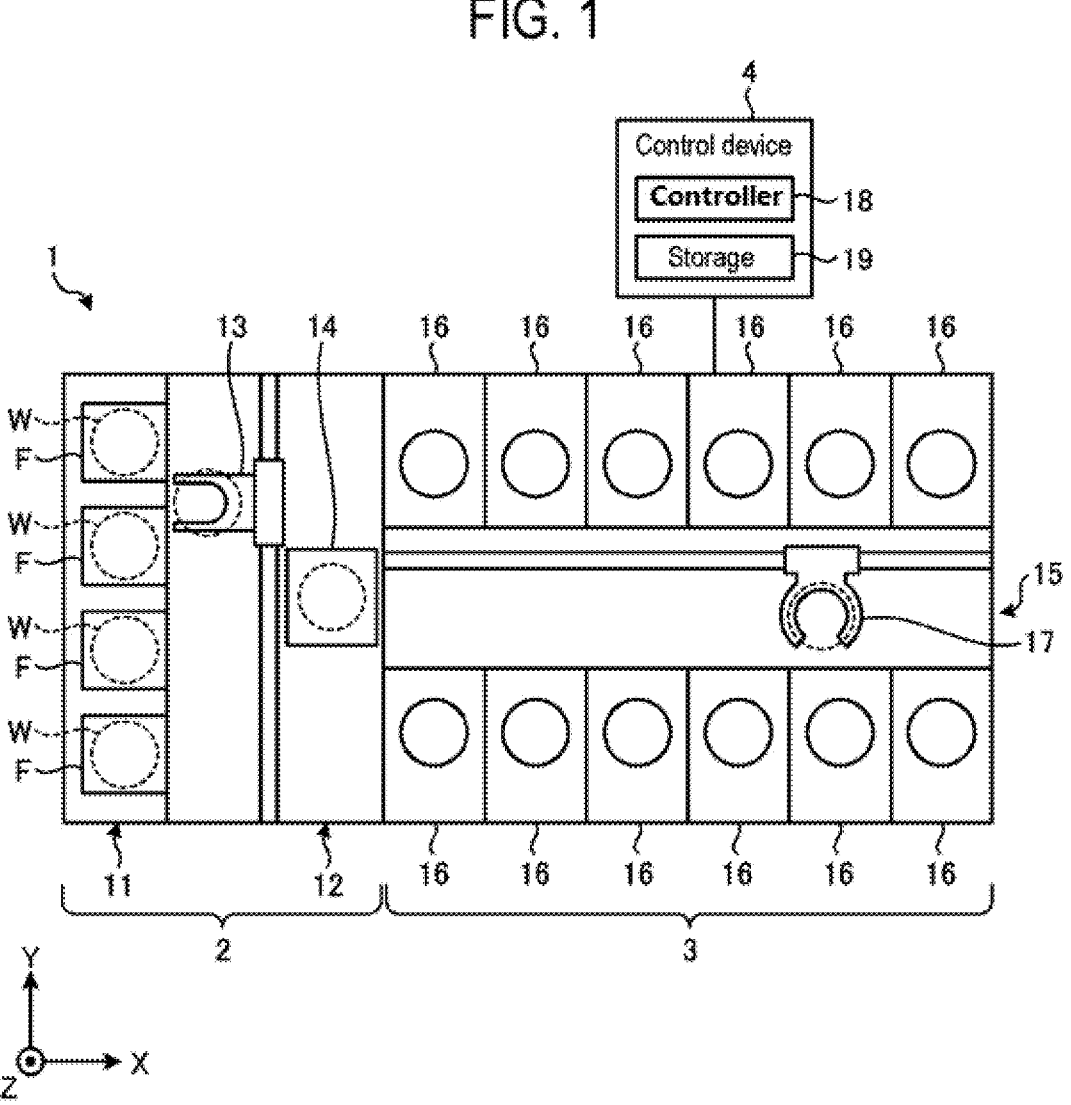
FIG. 1 is a diagram showing a schematic configuration of a substrate processing system according to a first embodiment.

Hereinafter, aspects (hereinafter referred to as "embodiments") for embodying a liquid supply device, a liquid supply method, and a storage medium according to the present disclosure will be described with reference to the drawings. The present disclosure is not limited to these embodiments. Further, the respective embodiments may be appropriately combined with each other to the extent that processing contents are not contradictory. In addition, the same parts in the following embodiments will be designated by like reference numerals, and duplicated descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In addition, in the embodiments described below, expressions such as "constant", "orthogonal", "vertical" and "parallel" may be used. These expressions do not necessarily mean "strictly constant", "strictly orthogonal", "strictly vertical" and "strictly parallel". In other words, each of the above expressions allows for, e.g., deviations in manufacturing accuracy and installation accuracy.

In addition, in each of the drawings to be referred to below, in order to facilitate ease of understanding the descriptions, an orthogonal coordinate system may be defined in which an X-axis direction, a Y-axis direction, and a Z-axis direction are orthogonal to one another, and the Z-axis positive direction is a vertically upward direction.

In the related art, there is known a liquid processing apparatus which circulates a processing liquid for a substrate such as a semiconductor wafer (hereinafter also referred to as a wafer) through a circulation line and supplies the processing liquid to a liquid processor via a branch line branching from the circulation line. The circulation line of the liquid processing apparatus is provided with a filter module (hereinafter also referred to as a filter) which removes foreign substances from the processing liquid and a temperature adjuster which adjusts a temperature of the processing liquid flowing through the circulation line.

In the circulation line, the circulation of the processing liquid may be stopped for maintenance or the like. When the circulation of the processing liquid is restarted after the stop of the circulation, the processing liquid is heated by the temperature adjuster. At this time, the filter thermally expands due to the influence of a change in the temperature of the processing liquid. This may cause particles trapped in the filter to be released from the filter, resulting in contamination of the processing liquid in the circulation line.

Therefore, a technique capable of reducing the contamination of the processing liquid in the circulation line is needed.

First Embodiment

<Overview of Substrate Processing System>

First, a schematic configuration of a substrate processing system 1 according to a first embodiment will be described with reference to FIG. 1. FIG. 1 is a diagram showing the schematic configuration of the substrate processing system 1 according to the first embodiment.

As shown in FIG. 1, the substrate processing system 1 includes a loading/unloading station 2 and a processing station 3. The loading/unloading station 2 and the processing station 3 are provided adjacent to each other.

The loading/unloading station 2 includes a FOUP stage 11 and a transferer 12. A plurality of FOUPs Fs is placed on the FOUP stage 11. Each of the plurality of FOUPs Fs accommodates a plurality of substrates, that is, semiconductor wafers W (hereinafter referred to as wafers W) in this embodiment, in a horizontal posture.

The transferer 12 is provided adjacent to the FOUP stage 11, and includes a substrate transfer device 13 and a deliverer 14 provided therein. The substrate transfer device 13 includes a wafer holding mechanism configured to hold the wafer W. The substrate transfer device 13 is movable in horizontal and vertical directions and rotatable about a vertical axis, and is configured to transfer the wafer W between the FOUP F and the deliverer 14 using the wafer holding mechanism.

The processing station 3 is provided adjacent to the transferer 12. The processing station 3 includes a transferer 15 and a plurality of processing units 16. The plurality of processing units 16 are provided side by side on both sides of the transferer 15.

The transferer 15 includes a substrate transfer device 17 provided therein. The substrate transfer device 17 includes a wafer holding mechanism configured to hold the wafer W. The substrate transfer device 17 is movable in the horizontal and vertical directions and rotatable about a vertical axis, and is configured to transfer the wafer W between the deliverer 14 and the processing unit 16 using the wafer holding mechanism.

The processing unit 16 is an example of a liquid processor, and is configured to perform a predetermined liquid processing on the wafer W transferred by the substrate transfer device 17.

Further, the substrate processing system 1 includes a control device 4. The control device 4 is, for example, a computer, and includes a controller 18 and a storage 19. The storage 19 stores programs for controlling various processes executed in the substrate processing system 1. The controller 18 controls the operation of the substrate processing system 1 by reading and executing the programs stored in the storage 19.

The program may be recorded in a computer-readable storage medium and installed from the storage medium in the storage 19 of the control device 4. Examples of the computer-readable storage medium include a hard disk (HD), a flexible disk (FD), a compact disk (CD), a magnet optical disk (MO), and a memory card.

In the substrate processing system 1 configured as above, first, the substrate transfer device 13 in the loading/unloading station 2 takes out the wafer W from the FOUP F placed on the FOUP stage 11, and places the same on the deliverer 14. Thereafter, the wafer W placed on the deliverer 14 is taken out from the deliverer 14 by the substrate transfer device 17 in the processing station 3, and is loaded into the processing unit 16.

The wafer W loaded into the processing unit 16 is processed by the processing unit 16. Thereafter, the wafer W is unloaded from the processing unit 16 by the substrate transfer device 17 and placed on the deliverer 14. Then, the processed wafer W placed on the deliverer 14 is returned to the FOUP F of the FOUP stage by the substrate transfer device 13.

<Overview of Processing Unit>

Figure 2:
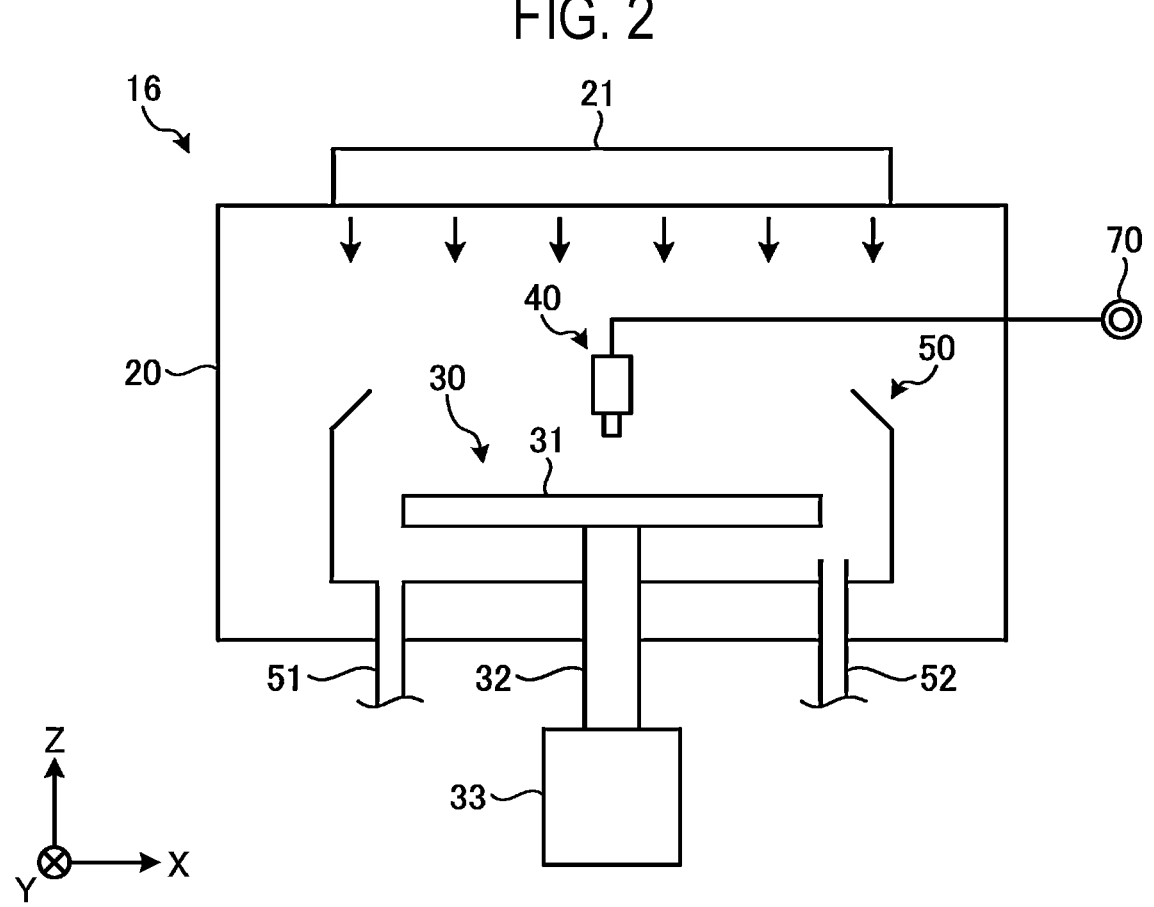
FIG. 2 is a schematic diagram showing a configuration of a processing unit according to a first embodiment.

Next, an overview of the processing unit 16 will be described with reference to FIG. 2. FIG. 2 is a schematic diagram showing a configuration of the processing unit 16 according to the first embodiment. The processing unit 16 includes a chamber 20, a substrate processor 30, a liquid supplier 40, and a collection cup 50.

The chamber 20 accommodates the substrate processor 30, the liquid supplier 40, and the collection cup 50. A fan filter unit (FFU) 21 is provided on a ceiling of the chamber 20. The FFU 21 forms a down-flow inside the chamber 20.

The substrate processor 30 includes a holder 31, a support 32, and a driver 33, and performs liquid processing on the placed wafer W. The holder 31 holds the wafer W (see FIG. 1) horizontally. The support 32 is a member extending in the vertical direction. A base end of the support 32 is rotatably supported by the driver 33, and a tip end thereof supports the holder 31 horizontally. The driver 33 rotates the support 32 about a vertical axis.

The substrate processor 30 rotates the holder 31 supported by the support 32 by rotating the support 32 using the driver 33. Thus, the wafer W held by the holder 31 is rotated.

The liquid supplier 40 supplies a processing liquid to the wafer W. The liquid supplier 40 is connected to a processing liquid source 70. The liquid supplier 40 includes a plurality of nozzles. The plurality of nozzles is provided to correspond to, for example, a plurality of types of processing liquid. The plurality of nozzles discharges, onto the wafer W, the plurality of types of processing liquid respectively supplied from the plurality of processing liquid sources 70.

The collection cup 50 is disposed to surround the holder 31, and is configured to collect the processing liquid scattered from the wafer W due to the rotation of the holder 31. A drain port 51 is formed in a bottom of the collection cup 50. The processing liquid collected by the collection cup 50 is discharged from the drain port 51 outward of processing unit 16.

Further, an exhaust port 52 is formed in the bottom of the collection cup 50 to exhaust the gas supplied from the FFU 21 outward of the processing unit 16.

<Overview of Processing Liquid Source>

Figure 3:
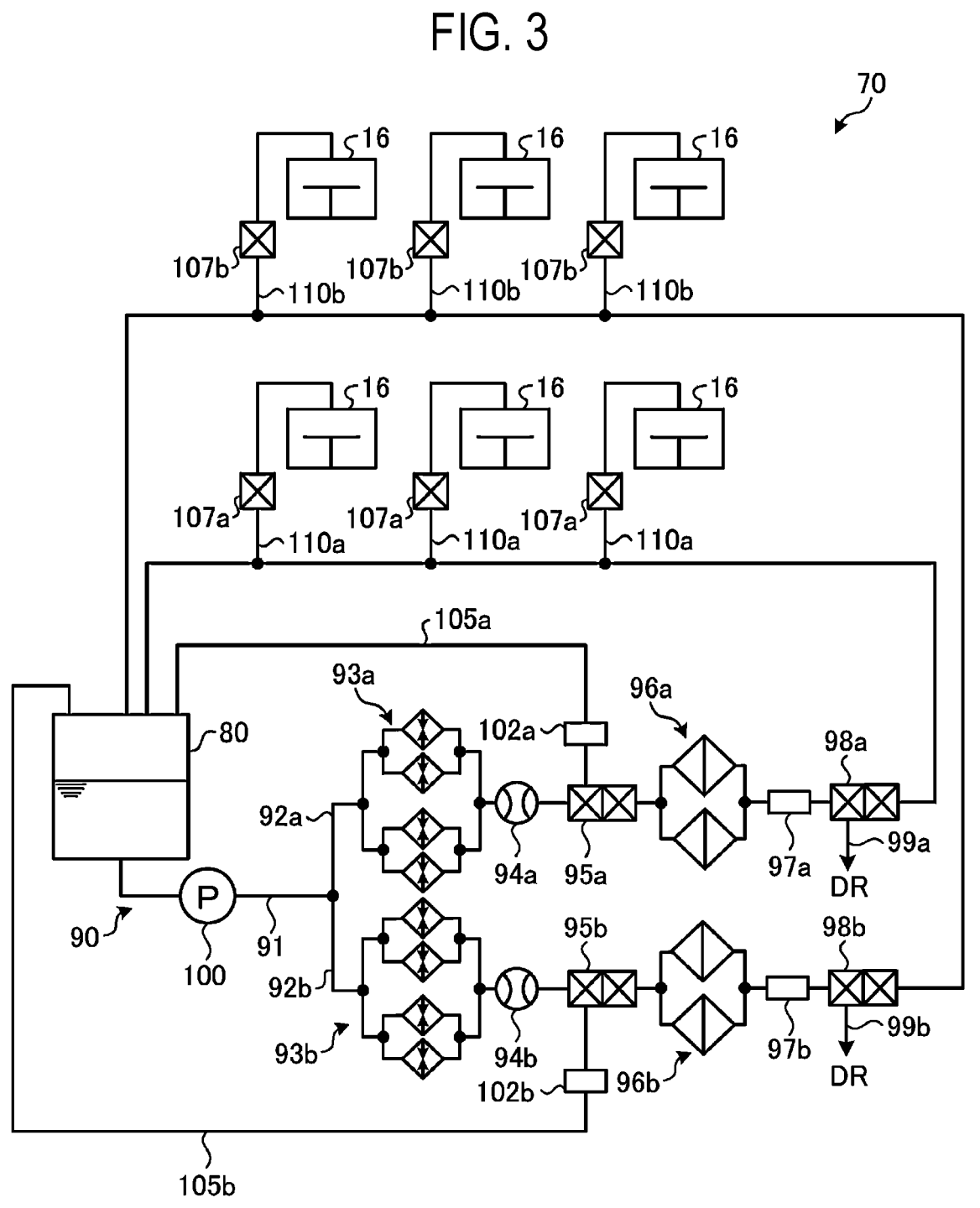

Next, a schematic configuration of the processing liquid source 70 provided in the substrate processing system 1 will be described with reference to FIG. 3. FIG. 3 is a diagram showing the schematic configuration of the processing liquid source 70 according to the embodiment. The processing liquid source 70 is an example of a liquid supply device.

A shown in FIG. 3, the processing liquid source 70 included in the substrate processing system 1 supplies the processing liquid to the plurality of processing units 16. In the first embodiment, for example, the processing liquid source 70 shown in FIG. 3 is provided for each of the plurality of types of processing liquids.

As shown in FIG. 3, the processing liquid source 70 includes a tank 80, a circulation line 90, and a pump 100. The tank 80 stores the processing liquid. The processing liquid is, for example, IPA (isopropyl alcohol). The processing liquid of the present disclosure is not limited to IPA, and various types of chemical liquids may be used.

The circulation line 90 returns the processing liquid sent from the tank 80 to the tank 80. The circulation line 90 includes a main line 91 on the upstream side and a plurality of (two in this embodiment) branch lines 92a and 92b (hereinafter also referred to as a "first branch line 92a" and a "second branch line 92b") on the downstream side.

Hereinafter, in this specification, the last letter of the reference numeral given to components belonging to the first branch line 92a is "a", and the last letter of the reference numeral given to components belonging to the second branch line 92b is "b". The components belonging to the first branch line 92a and the components belonging to the second branch line 92b are the same or substantially the same. When it is not necessary to distinguish between the components belonging to the first branch line 92a and the components belonging to the second branch line 92b, the last letters "a" and "b" may be omitted (for example, 93a and 93b may be written as 93).

The pump 100 is provided in the main line 91. The pump 100 forms a circulating flow of the processing liquid in the circulation line 90.

The main line 91 branches into the first branch line 92a and the second branch line 92b at a branch (branch point) set at its downstream end, that is, downstream of the pump 100. The processing liquid flowing out of the tank 80 passes through the main line 91, then flows into the first branch line 92a and the second branch line 92b, and returns to the tank 80 via the first branch line 92a and the second branch line 92b.

That is, in the processing liquid source 70 according to the first embodiment, a driving force generated by the pump 100 causes the processing liquid to circulate in both the first branch line 92a and the second branch line 92b of the circulation line 90. This makes it possible to reduce the number of pumps and the cost of the processing liquid source, compared to a case in which a pump is provided in each of the first branch line 92a and the second branch line 92b.

The first branch line 92a includes a first heating mechanism 93a, a first flowmeter 94a, a third valve 95a, a first filter 96a, a first circulation temperature sensor 97a, and a first valve 98a which are arranged sequentially from the upstream side. The second branch line 92b includes a second heating mechanism 93b, a second flowmeter 94b, a fourth valve 95b, a second filter 96b, a second circulation temperature sensor 97b, and a second valve 98b which are arranged sequentially from the upstream side.

The heating mechanisms 93 (the first heating mechanism 93a and the second heating mechanism 93b) heat the processing liquid passing through the heating mechanisms 93. The controller 18 may adjust a temperature of the processing liquid by controlling an amount of heat applied to the processing liquid by the heating mechanisms 93. Each of the first heating mechanism 93a and the second heating mechanism 93b includes a plurality of heating modules arranged in parallel. The heating mechanisms 93 are controlled by the controller 18.

The number of heating modules belonging to one heating mechanism 93 may be determined in consideration of a temperature control capacity required for the heating mechanism 93 and an allowable pressure drop in the heating mechanism 93. In the first embodiment, as shown in FIG. 3, each of the first heating mechanism 93a and the second heating mechanism 93b includes four heating modules arranged in parallel.

The flowmeters 94 (the first flowmeter 94a and the second flowmeter 94b) measure a flow rate of the circulating flow of the processing liquid formed in the circulation line 90. Measurement results obtained by the flowmeters 94 are outputted to the controller 18.

The valves 95 (the third valve 95a and the fourth valve 95b) switch a destination of the processing liquid. Specifically, the first branch circulation line 105a connected to the tank 80 branches from the third valve 95a. The first branch circulation line 105a returns the processing liquid sent from the tank 80 to the first branch line 92a to the tank 80. The third valve 95a switches the destination of the processing liquid in the first branch line 92a between the first branch circulation line 105a and the first filter 96a. For example, when the controller 18 controls the third valve 95a to set the destination of the processing liquid to the first branch circulation line 105a, the processing liquid sent from the tank 80 returns to the tank 80 via the third valve 95a. Further, for example, when the controller 18 controls the third valve 95a to set the destination of the processing liquid to the first filter 96a, the processing liquid sent from the tank 80 flows into the first filter 96a via the third valve 95a. In addition, the controller 18 may also control the third valve 95a such that the processing liquid flows into both the first branch circulation line 105a and the first filter 96a.

The first branch circulation line 105a is provided with a first branch temperature sensor 102a for detecting the temperature of the processing liquid flowing through the first branch circulation line 105a. Detection results obtained by the first branch temperature sensor 102a are outputted to the controller 18.

Similarly, the second branch circulation line 105b connected to the tank 80 branches from the fourth valve 95b. The second branch circulation line 105b returns the processing liquid sent from the tank 80 to the second branch line 92b to the tank 80. The fourth valve 95b switches the destination of the processing liquid in the second branch line 92b between the second branch circulation line 105b and the second filter 96b. For example, when the controller 18 controls the fourth valve 95b to set the destination of the processing liquid to the second branch circulation line 105b, the processing liquid sent from the tank 80 returns to the tank 80 via the fourth valve 95b. Further, for example, when the controller 18 controls the fourth valve 95b to set the destination of the processing liquid to the second filter 96b, the processing liquid sent from the tank 80 flows into the second filter 96b via the fourth valve 95b. The controller 18 may also control the fourth valve 95b such that the processing liquid flows into both the second branch circulation line 105b and the second filter 96b.

The second branch circulation line 105b is provided with a second branch temperature sensor 102b for detecting the temperature of the processing liquid flowing through the second branch circulation line 105b. Detection results obtained by the second branch temperature sensor 102b are outputted to the controller 18.

As described above, the processing liquid source 70 according to the first embodiment includes the first branch circulation line 105a and the second branch circulation line 105b. As a result, in a process of forming a circulating flow of the processing liquid in the circulation line 90 again after the circulation of the processing liquid has been stopped for maintenance or the like, by heating the processing liquid while forming the circulating flow of the processing liquid flowing through the first branch circulation line 105a or the second branch circulation line 105b, it is possible to perform a process of increasing the temperature of the processing liquid without passing the processing liquid through the filter 96.

Therefore, according to the first embodiment, it is possible to reduce contamination of the processing liquid caused by the particles released from the filter 96 as the temperature of the processing liquid increases. Further, in the first embodiment, since the processing liquid does not flow through the filter 96 in which particles are trapped, it is possible to reduce the contamination of the processing liquid during the temperature increasing process.

The filters 96 (the first filter 96a and the second filter 96b) remove contaminants such as particles contained in the processing liquid passing through the filters 96. Each of the first filter 96a and the second filter 96b may include a plurality of filter modules arranged in parallel. The number of filter modules belonging to one filter 96 may be determined in consideration of a filtering capacity required for the filters 96 and an allowable pressure drop in the filters 96. In the first embodiment, as shown in FIG. 3, each of the first filter 96a and the second filter 96b is constituted with two filter modules arranged in parallel.

The circulation temperature sensors 97 (the first circulation temperature sensor 97a and the second circulation temperature sensor 97b) detect the temperature of the processing liquid flowing through the circulation line 90. Detection results obtained by the circulation temperature sensors 97 are outputted to the controller 18.

The circulation temperature sensors 97 do not necessarily need to detect the temperature of the processing liquid flowing through the circulation line 90. For example, the circulation temperature sensors 97 may be provided on the filters 96, the circulation line 90 (the first branch line 92a and the second branch line 92b), and the drain line 99, to detect the temperatures of the filters 96, the circulation line 90, and the drain line 99.

Further, although the example has been described in which two temperature sensors, that is, the first circulation temperature sensor 97a and the second circulation temperature sensor 97b are provided, the present disclosure is not limited thereto. Only one of the two temperature sensors may be provided.

The valves 98 (the first valve 98a and the second valve 98b) switch the destination of the processing liquid. Specifically, the first drain line 99a connected to the drainer DR branches from the first valve 98a. The first drain line 99a drains the processing liquid flowing into the first branch line 92a. The first valve 98a switches the destination of the processing liquid in the first branch line 92a between the first drain line 99a and the first branch line 92a. For example, when the controller 18 controls the first valve 98a to set the destination of the processing liquid to the first drain line 99a, the processing liquid sent from the tank 80 is drained via the first valve 98a. Further, for example, when the controller 18 controls the first valve 98a to set the destination of the processing liquid to the first branch line 92a, the processing liquid sent from the tank 80 flows into the first branch line 92a via the first valve 98a. The controller 18 may also control the first valve 98a such that the processing liquid flows into both the first branch line 92a and the first drain line 99a.

Similarly, the second drain line 99b connected to the drainer DR branches from the second valve 98b. The second drain line 99b drains the processing liquid flowing into the second branch line 92b. The second valve 98b switches the destination of the processing liquid in the second branch line 92b between the second drain line 99b and the second branch line 92b. For example, when the controller 18 controls the second valve 98b to set the destination of the processing liquid to the second drain line 99b, the processing liquid sent from the tank 80 is drained via the second valve 98b. Further, for example, when the controller 18 controls the second valve 98b to set the destination of the processing liquid to the second branch line 92b, the processing liquid sent from the tank 80 flows into the second branch line 92b via the second valve 98b. The controller 18 may also control the second valve 98b such that the processing liquid flows into both the second branch line 92b and the second drain line 99b.

A plurality of first supply lines 110a is connected to the first branch line 92a located downstream of the first valve 98a. One end of the first supply line 110a is connected to the first branch line 92a, and the other end thereof is connected to the processing unit 16. The first supply line 110a supplies the processing liquid flowing through the first branch line 92a to the processing unit 16. A fifth valve 107a for opening and closing the first supply line 110a is provided in the middle of the first supply line 110a.

A plurality of second supply lines 110b is connected to the second branch line 92b located downstream of the second valve 98b. One end of the second supply line 110b is connected to the second branch line 92b, and the other end thereof is connected to the processing unit 16. The second supply line 110b supplies the processing liquid flowing through the second branch line 92b to the processing unit 16. A sixth valve 107b for opening and closing the second supply line 110b is provided in the middle of the second supply line 110b.

FIG. 3 shows an example in which three first supply lines 110a are connected to the first branch line 92a. However, the number of first supply lines 110a connected to the first branch line 92a is not limited to three. Similarly, the number of second supply lines 110b connected to the second branch line 92b is not limited to three.

In addition, in the above, the example has been described in which the first valve 98a, the second valve 98b, the third valve 95a, and the fourth valve 95b are switching valves for switching the destination of the processing liquid. However, the first valve 98a, the second valve 98b, the third valve 95a, and the fourth valve 95b do not necessarily need to be switching valves. For example, the first valve 98a may be constituted with two opening/closing valves, that is, an opening/closing valve provided in the first drain line 99a and an opening/closing valve provided in the first branch line 92a downstream of the first drain line 99a. This holds true with respect to the second valve 98b, the third valve 95a, and the fourth valve 95b.

Figure 4:
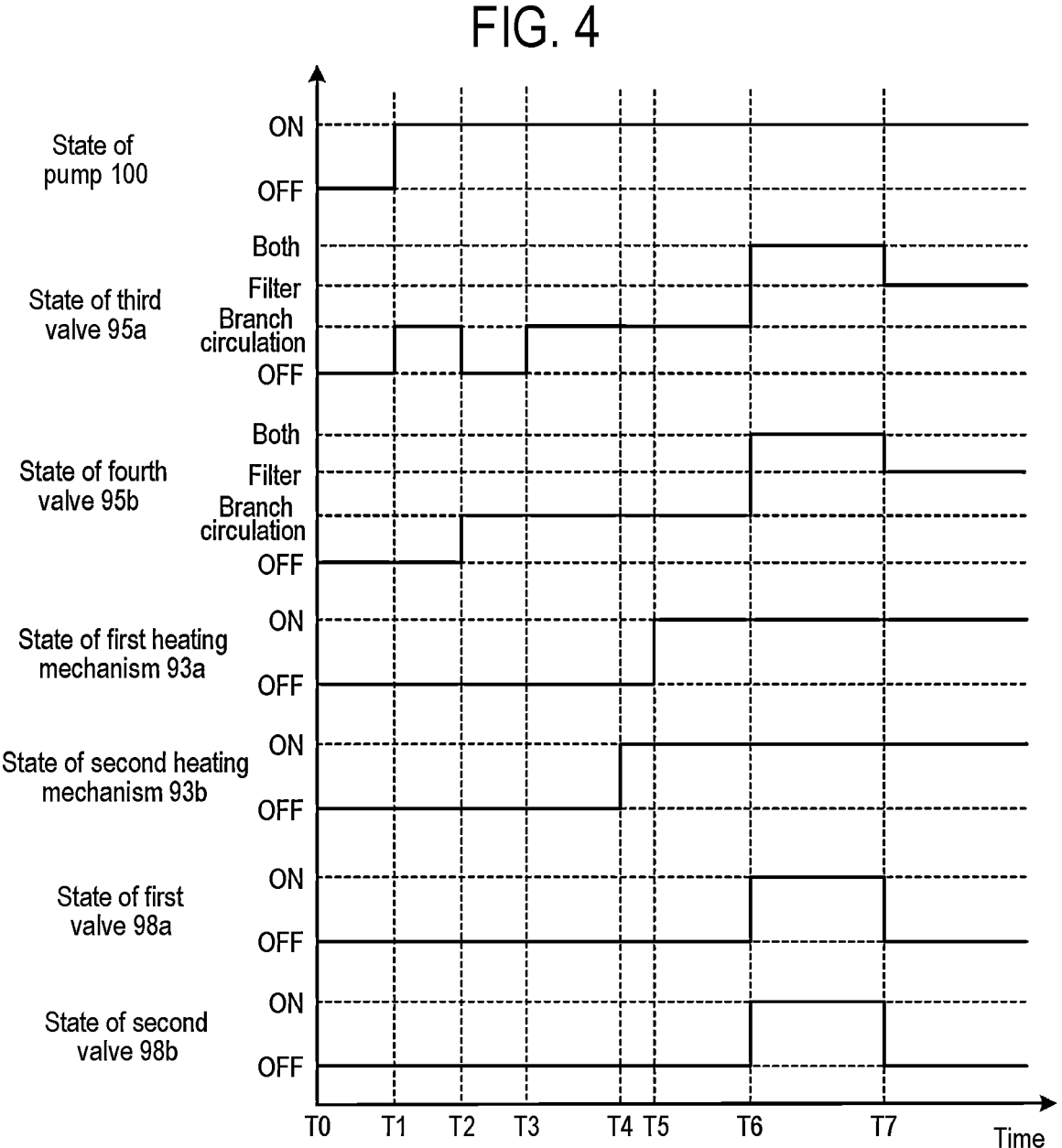
FIG. 4 is a diagram showing an example of state transitions of a pump, first to fourth valves, a first heating mechanism, and a second heating mechanism.
Figure 5:
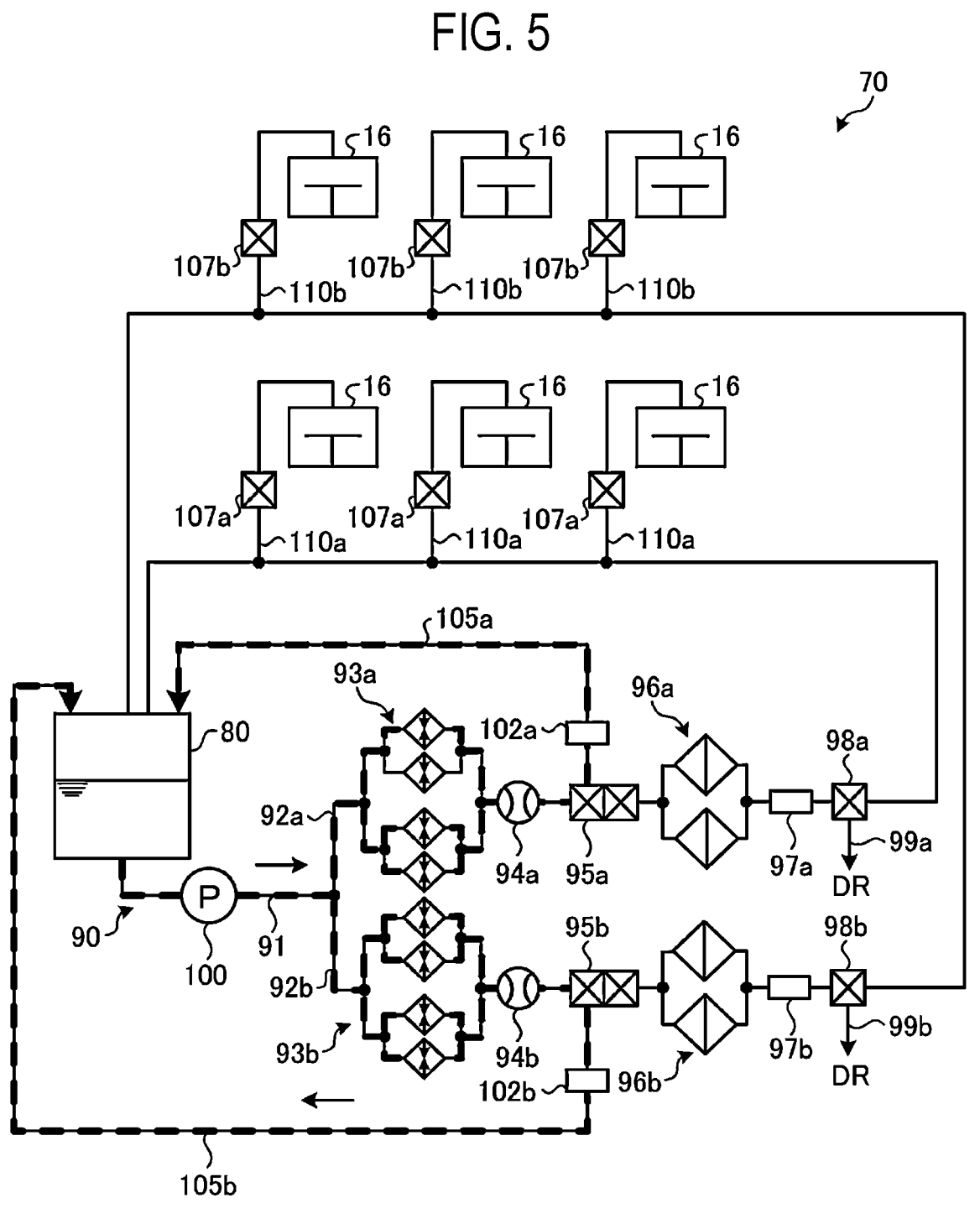
Figure 6:
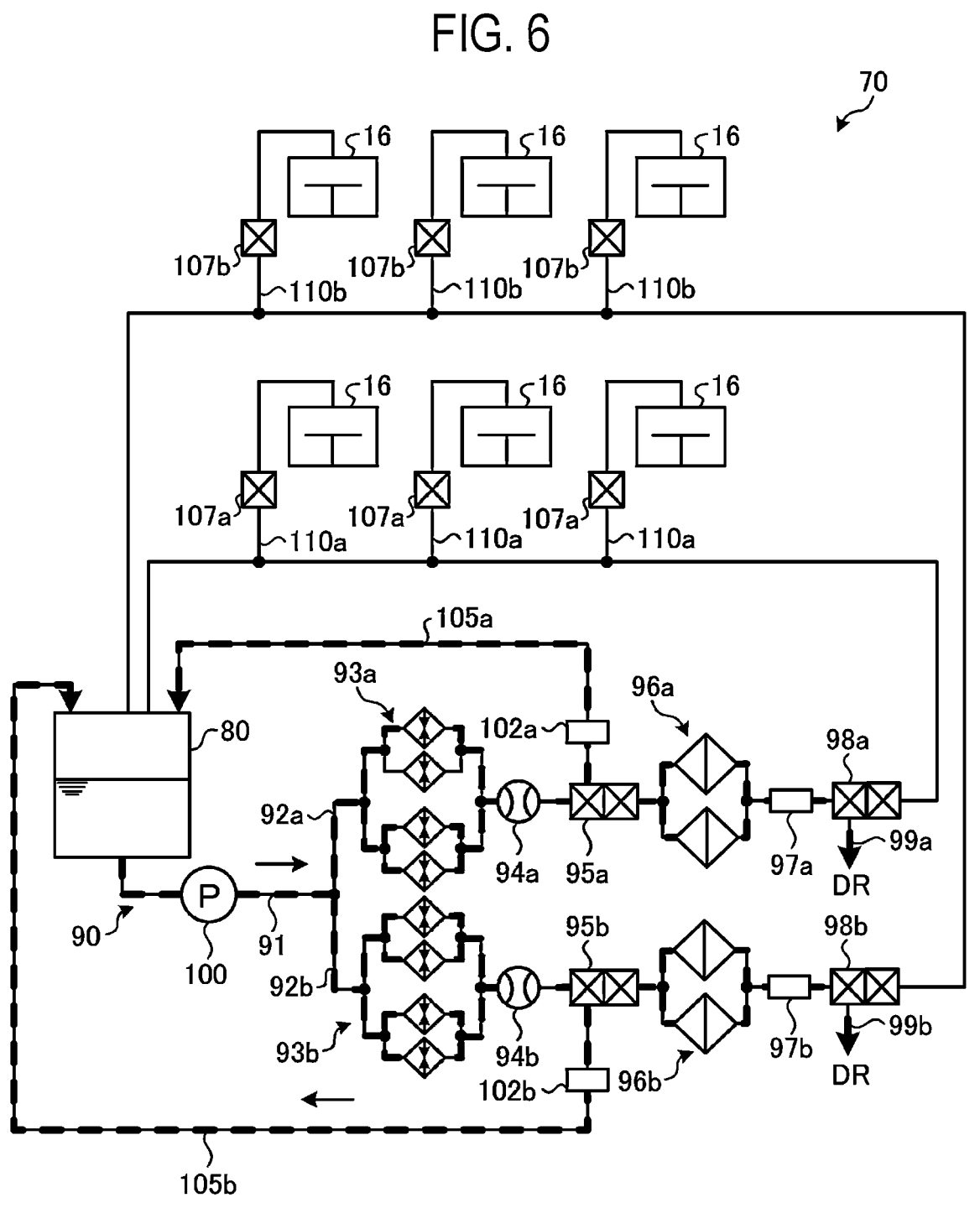
Figure 7:
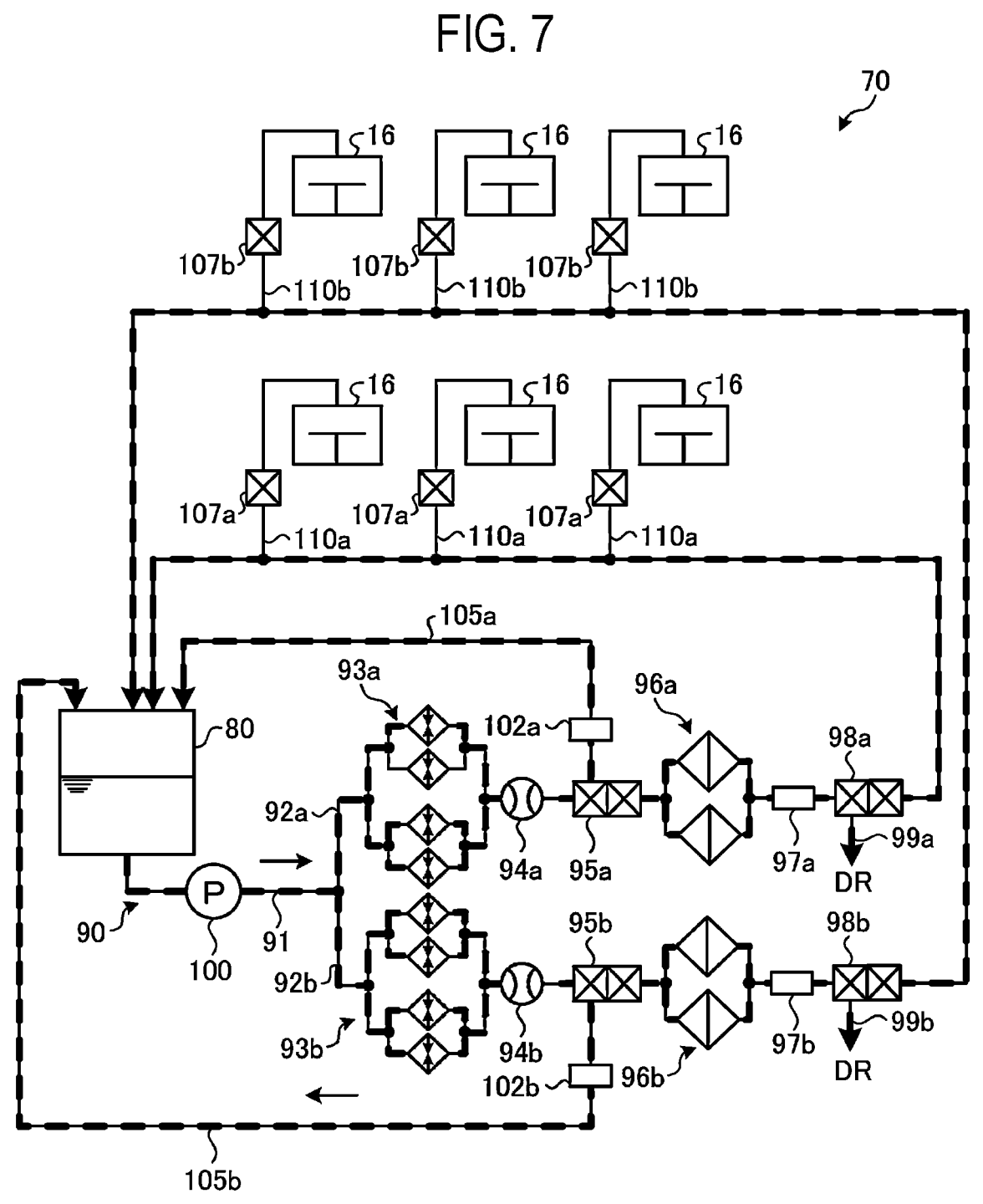

Next, an example of an operation of the substrate processing system 1 according to the first embodiment will be described with reference to FIG. 4. FIG. 4 is a diagram showing an example of state transitions of the pump 100, the first valve 98a to the fourth valve 95b, the first heating mechanism 93a, and the second heating mechanism 93b. FIGS. 5 to 7 are schematic diagrams showing an example of an operation of the processing liquid source 70 according to the first embodiment. A process shown in FIG. 4 is an example of the operation when starting the circulation of the processing liquid again after the circulation of the processing liquid in the circulation line 90 has stopped for maintenance or the like.

First, the controller 18 operates the pump 100, which has been stopped, to pump the processing liquid from the tank 80 to the circulation line 90 (time T1). At the same time, the controller 18 controls the third valve 95a such that the processing liquid flows into the first branch circulation line 105a. As a result, the processing liquid sent from the tank 80 flows into the first branch circulation line 105a via the third valve 95a and circulates to return to the tank 80.

Subsequently, the controller 18 closes the third valve 95a to stop the flow of the processing liquid to the first branch circulation line 105a (time T2). At the same time, the controller 18 controls the fourth valve 95b such that the processing liquid flows into the second branch circulation line 105b. As a result, the processing liquid sent from the tank 80 flows into the second branch circulation line 105b via the fourth valve 95b and circulates to return to the tank 80.

Subsequently, the controller 18 controls the third valve 95a such that the processing liquid flows into the first branch circulation line 105a (time T3). As a result, the processing liquid sent from the tank 80 flows into the first branch circulation line 105a and the second branch circulation line 105b, and circulates to return to the tank 80 (see FIG. 5).

Subsequently, the controller 18 determines whether or not a circulation flow rate of the processing liquid flowing through the first branch circulation line 105a and the second branch circulation line 105b is stable based on measurement values obtained by the first flowmeter 94a and the second flowmeter 94b. Specifically, when the measurement value by the first flowmeter 94a falls within a preset threshold range, the controller 18 determines that the circulation flow rate of the processing liquid is stable, and controls the first heating mechanism 93a to start heating. Similarly, when the measurement value by the second flowmeter 94b falls within a preset threshold range, the controller 18 determines that the circulation flow rate of the processing liquid in the second branch line 92b is stable, and controls the second heating mechanism 93b to start heating. For example, as shown in FIG. 4, when the measurement value by the second flowmeter 94b is determined to fall within the threshold range, the controller 18 operates the second heating mechanism 93b (time T4). Then, when the measurement value by the first flowmeter 94a is determined to fall within the threshold range, the controller 18 operates the first heating mechanism 93a (time T5).

Subsequently, the controller 18 determines whether or not the temperature of the processing liquid flowing through the first branch circulation line 105a and the second branch circulation line 105b is stable based on the detection results obtained by the first branch temperature sensor 102a and the second branch temperature sensor 102b. Specifically, when the measurement value by the first branch temperature sensor 102a falls within a preset threshold range in a preset monitoring time width, the controller 18 determines that the temperature of the processing liquid in the first branch circulation line 105a is stable. Similarly, when the measurement value of the second branch temperature sensor 102b falls within a preset threshold range in a preset monitoring time width, the controller 18 determines that the temperature of the processing liquid in the second branch circulation line 105b is stable.

When the temperatures of the processing liquid in the first branch line 92a and the second branch line 92b are determined to be stable, the controller 18 controls the first valve 98a to the fourth valve 95b such that the processing liquid flows into the drain line 99 while circulating in the first branch circulation line 105a and the second branch circulation line 105b. For example, as shown in FIG. 4, when the measurement values by the first branch temperature sensor 102a and the second branch temperature sensor 102b are determined to fall within the preset threshold range in the preset monitoring time width, the controller 18 controls the third valve 95a and the fourth valve 95b such that the processing liquid flows into both the filter 96 and the branch circulation line 105 (time T6).

At the same time, the controller 18 controls the first valve 98a and the second valve 98b such that the processing liquid flows into the first drain line 99a and the second drain line 99b. As a result, the processing liquid sent from the tank 80 flows into the first filter 96a and the second filter 96b and is drained from the drain line 99, while flowing into the first branch circulation line 105a or the second branch circulation line 105b and circulating back to the tank 80 (see FIG. 6).

Subsequently, the controller 18 determines whether or not to drain the processing liquid from the drain line 99 based on the detection results by the first circulation temperature sensor 97a and the second circulation temperature sensor 97b. Specifically, when the measurement values by the first circulation temperature sensor 97a and the second circulation temperature sensor 97b are equal to or greater than a threshold value, the controller 18 controls the first valve 98a to the fourth valve 95b to switch the destination of the processing liquid from the drain line 99 to the supply line 110.

For example, as shown in FIG. 4, when the measurement values by both the first circulation temperature sensor 97a and the second circulation temperature sensor 97b are equal to or greater than the threshold value, the controller 18 controls the third valve 95a and the fourth valve 95b to switch the destination of the processing liquid to the filter 96 (time T7). At the same time, the controller 18 controls the first valve 98a and the second valve 98b to switch the destination of the processing liquid to the supply line 110. As a result, the processing liquid sent from the tank 80 flows into the first branch line 92a and the second branch line 92b and returns to the tank 80 (see FIG. 7). In addition, when the fifth valve 107a or the sixth valve 107b remains open, the processing liquid is supplied from the supply line 110 to the processing unit 16.

In this way, the controller 18 determines whether or not to drain the processing liquid from the drain line 99 based on the detection results by the first circulation temperature sensor 97a and the second circulation temperature sensor 97b. Specifically, when the temperature of the processing liquid flowing through the circulation line 90 is determined to be equal to or higher than the threshold value based on the detection results by the first circulation temperature sensor 97*a* and the second circulation temperature sensor 97*b*, the controller 18 controls the first valve 98*a* and the second valve 98*b* to switch the destination of the processing liquid from the drain line 99 to the supply line 110.

In the above, the example has been described in which the destination of the processing liquid is switched from the drain line 99 to the supply line 110 when the temperature of the processing liquid flowing through the circulation line 90 is equal to or higher than the threshold value. However, the present disclosure is not limited thereto. For example, when the temperature of the processing liquid flowing through the circulation line 90 becomes equal to or higher than the threshold value, the processing liquid may be continuously drained until a predetermined period of time elapses. Specifically, when the temperature of the processing liquid flowing through the circulation line 90 becomes equal to or higher than the threshold value, the controller 18 controls the first valve 98*a* and the second valve 98*b* to switch the destination of the processing liquid to the drain line 99 and the supply line 110. As a result, the processing liquid sent from the tank 80 is drained from the drain line 99 at a certain amount while flowing into the branch line 92. Thereafter, the controller 18 switches the destination of the processing liquid to the supply line 110 when a predetermined period time elapses.

After the processing liquid heated by the heating mechanism 93 starts to be drained (time T6), the temperature of the processing liquid flowing through the circulation line 90 gradually increases. Thereafter, when the temperature of the processing liquid reaches or exceeds a threshold value, most of the particles trapped in the filter 96 flow out. This lessens the likelihood of contaminating the interior of the circulation line 90. By stopping the drain of the processing liquid at that point (time T7) and starting the circulation of the processing liquid in the circulation line 90, it is possible to minimize the amount of processing liquid to be drained.

Further, the controller 18 controls the pump 100, the first heating mechanism 93*a*, and the second heating mechanism 93*b* to heat the processing liquid while the processing liquid circulates in the first branch circulation line 105*a* and the second branch circulation line 105*b* (time T5 to time T7).

As described above, the controller 18 controls the operation of the substrate processing system such that the processing liquid is heated while circulating in the first branch circulation line 105*a* and the second branch circulation line 105*b*. Thus, it is possible to efficiently heat the processing liquid in a short period of time compared to a case where the processing liquid is heated while totally circulating in the circulation line 90.

Further, when the temperatures of the processing liquid flowing through the first branch circulation line 105*a* and the second branch circulation line 105*b* is determined to be stable based on the detection results by the first branch temperature sensor 102*a* and the second branch temperature sensor 102*b*, the controller 18 controls the pump 100 to send the processing liquid to the filter 96 (time T6). Thus, it is possible to send the processing liquid to the circulation line 90 after the temperature of the processing liquid is stable.

Further, the controller 18 controls the pump 100, the first valve 98*a*, and the second valve 98*b* to send the processing liquid circulating in the first branch circulation line 105*a* and the second branch circulation line 105*b* to the first filter 96*a* and the second filter 96*b*, so that the processing liquid passed through the first filter 96*a* and the second filter 96*b* is drained via the first drain line 99*a* and the second drain line 99*b* (time T6 to time T7).

Therefore, the processing liquid may be drained when particles trapped in the first filter 96*a* and the second filter 96*b* are released due to a change in the temperature of the processing liquid. This makes it possible to reduce contamination of the processing liquid in the circulation line 90 by the particles.

When the measurement values obtained by the first flowmeter 94*a* and the second flowmeter 94*b* are determined to fall within their respective threshold ranges, the controller 18 controls the third valve 95*a* to switch the destination of the processing liquid in the first branch circulation line 105*a* from the first branch circulation line 105*a* to the first filter 96*a*, and controls the fourth valve 95*b* to switch the destination of the processing liquid in the second branch circulation line 105*b* from the second branch circulation line 105*b* to the second filter 96*b*. This makes it possible to send the processing liquid to the first filter 96*a* and the second filter 96*b* after the flow rate of the processing liquid is stable (time T4 and time T5).

Further, the controller 18 starts to send the processing liquid to the first branch circulation line 105*a* (time T1), and then starts to send the processing liquid to the second branch circulation line 105*b* (time T2). By sending the processing liquid line by line in this way, the processing liquid is more likely to become full than when the processing liquid is sent to both lines at the same time.

After the processing liquid is drained from the first drain line 99*a* and the second drain line 99*b*, the controller 18 controls the first valve 98*a* and the second valve 98*b* to send the processing liquid to the first branch line 92*a* and the second branch line 92*b* and to return the processing liquid to the tank 80 (time T7). This makes it possible to reduce the contamination of the interior of the tank 80 caused when the particles trapped by the filter 96 inside the tank 80 flow into the tank 80.

Further, the controller 18 controls the operation of the substrate processing system such that the processing liquid circulates in the first branch circulation line 105*a* and the second branch circulation line 105*b* (time T6 to time T7) while circulating the processing liquid in the circulation line 90. This makes it possible to prevent the processing liquid from staying in the first branch circulation line 105*a* and the second branch circulation line 105*b* while the processing liquid is circulating in the circulation line 90.

As described above, the processing liquid source 70 according to the first embodiment includes the first branch circulation line 105*a* and the second branch circulation line 105*b*. With this configuration, in the process of forming a circulation flow of the processing liquid in the circulation line 90 again after the circulation of the processing liquid has been stopped for maintenance or the like, by heating the processing liquid while forming the circulation flow of the processing liquid flowing through the first branch circulation line 105*a* or the second branch circulation line 105*b*, a process of increasing the temperature of the processing liquid may be performed without passing the processing liquid through the filter 96.

Therefore, according to the first embodiment, it is possible to reduce contamination caused by the particles passing through the filter 96 as the temperature of the processing liquid increases.

In the above, the example has been described in which the processing liquid being heated is discharged to the drainer DR via the drain line 99, and then the circulating flow of the processing liquid passing through the circulation line 90 is formed. However, the present disclosure is not limited thereto.

For example, the controller 18 may repeatedly perform a process of, before starting the circulation of the processing liquid in the circulation line 90, heating the processing liquid while circulating the processing liquid in the first branch circulation line 105*a* and the second branch circulation line 105*b* (time T4 and time T5), sending the processing liquid circulating in the first branch circulation line 105*a* and the second branch circulation line 105*b* to the filter 96, and draining the processing liquid via the drain line 99 (time T6 and time T7).

With this configuration, it is possible to flow a larger number of particles trapped in the filter 96 toward the downstream side, thus further reducing contamination of the processing liquid in the circulation line 90.

Second Embodiment

In the above-described first embodiment, the example has been described in which the determination as to whether or not to proceed with a subsequent process is made based on the detection results by the plurality of temperature sensors. However, it is not necessarily required to perform the determination process based on the results by the temperature sensors.

Specifically, at time T7 shown in FIG. 4, the controller 18 determines whether or not to drain the processing liquid from the drain line 99 based on the detection results by the first circulation temperature sensor 97*a* and the second circulation temperature sensor 97*b*. However, the present disclosure is not limited to this example. For example, the controller 18 may switch the destination of the processing liquid to the supply line 110 after a preset period of time since the processing liquid started to be drained from the drain line 99.

In addition, for example, the processing liquid source 70 may include a flowmeter arranged between the valve 95 and the drain line 99. Specifically, the processing liquid source 70 may include a flowmeter arranged between the third valve 95*a* and the first drain line 99*a*. Further, the processing liquid source 70 may include a flowmeter arranged between the fourth valve 95*b* and the second drain line 99*b*. In this case, after starting to drain the processing liquid from the drain line 99, the controller 18 may switch the destination of the processing liquid to the supply line 110 after the measurement value by the flowmeter falls within a threshold range.

According to the present disclosure in some embodiments, it is possible to reduce contamination of a processing liquid in a circulation line.

The embodiments disclosed herein should be considered to be exemplary and not limitative in all respects. Indeed, the above-described embodiments may be embodied in various forms. Further, the above-described embodiments may be omitted, substituted, or modified in various forms without departing from the scope and spirit of the appended claims.

The present disclosure may have the following configurations.

(1) A liquid supply device includes a tank configured to store a processing liquid, a circulation line configured to return the processing liquid sent from the tank to the tank, a pump provided in the circulation line, and a supply line connected to the circulation line and configured to supply the processing liquid to a liquid processor for performing liquid processing on a substrate. The circulation line includes a main line in which the pump is provided, and a first branch line and a second branch line branching from the main line. The supply line includes a first supply line connected to the first branch line and a second supply line connected to the second branch line. The first branch line includes a first heating mechanism, a first filter, and a first drain line configured to drain the processing liquid flowing through the first branch line, which are arranged sequentially from an upstream side. The first branch line further includes a first branch circulation line branching from between the first heating mechanism and the first filter to return the processing liquid sent from the tank to the tank, and a first valve provided between the first drain line and the first branch line to switch a destination of the processing liquid. The second branch line includes a second heating mechanism, a second filter, and a second drain line configured to drain the processing liquid flowing through the second branch line, which are arranged sequentially from an upstream side. The second branch line further includes a second branch circulation line branching from between the second heating mechanism and the second filter to return the processing liquid sent from the tank to the tank, and a second valve provided between the second drain line and the second branch line to switch a destination of the processing liquid.

(2) The liquid supply device of (1) above further includes a controller. The controller controls the pump, the first heating mechanism, and the second heating mechanism to heat the processing liquid while allowing the processing liquid to flow through the first branch circulation line and the second branch circulation line.

(3) In the liquid supply device of (2) above, the controller controls the pump, the first valve, and the second valve to send the processing liquid circulating in the first branch circulation line and the second branch circulation line to the first filter and the second filter, and to drain the processing liquid passed through the first filter and the second filter into the first drain line and the second drain line.

(4) The liquid supply device of (2) or (3) above further includes a first flowmeter arranged between the first heating mechanism and the first branch circulation line, a second flowmeter arranged between the second heating mechanism and the second branch circulation line, a third valve configured to switch the destination of the processing liquid in the first branch line between the first branch circulation line and the first filter, and a fourth valve configured to switch the destination of the processing liquid in the second branch line between the second branch circulation line and the second filter. After each of a measurement value obtained by the first flowmeter and a measurement value obtained by the second flowmeter falls within a threshold range, the controller controls the third valve to switch the destination of the processing liquid in the first branch circulation line from the first branch circulation line to the first filter, and controls the fourth valve to switch the destination of the processing liquid in the second branch circulation line from the second branch circulation line to the second filter.

(5) In the liquid supply device of any one of (2) to (4) above, the controller starts to send the processing liquid to the first branch circulation line, and subsequently, starts to send the processing liquid to the second branch circulation line.

(6) In the liquid supply device of (3) above, after the processing liquid is drained from the first drain line and the second drain line, the controller controls the first valve and the second valve to send the processing liquid to the first branch line and the second branch line and to return the processing liquid to the tank.

(7) A liquid supply method performed in the liquid supply device of (1) above includes heating the processing liquid while circulating the processing liquid in the first branch circulation line, and heating the processing liquid while circulating the processing liquid in the second branch circulation line.

(8) The liquid supply method of (7) above further includes sending the processing liquid circulating in the first branch circulation line to the first filter, and draining the processing liquid passed through the first filter into the first drain line, and sending the processing liquid circulating in the second branch circulation line to the second filter, and draining the processing liquid passed through the second filter into the second drain line.

(9) A non-transitory computer-readable storage medium stores a program that operates on a computer and controls a liquid supply device. The program, when executed, causes the computer to control the liquid supply device so as to perform the liquid supply method of (7) or (8) above.

What is claimed is:

1. A liquid supply device, comprising:
a tank configured to store a processing liquid;
a circulation line configured to return the processing liquid sent from the tank to the tank;
a pump provided in the circulation line; and
a supply line connected to the circulation line and configured to supply the processing liquid to a liquid processor for performing liquid processing on a substrate,
wherein the circulation line includes a main line in which the pump is provided, and includes a first branch line and a second branch line branching from the main line,
wherein the supply line includes a first supply line connected to the first branch line and a second supply line connected to the second branch line,
wherein the first branch line includes a first heating mechanism, a first filter, and a first drain line configured to drain the processing liquid flowing through the first branch line, which are arranged sequentially from an upstream side, the first branch line further including a first branch circulation line branching from between the first heating mechanism and the first filter to return the processing liquid sent from the tank to the tank, and including a first valve provided between the first drain line and the first branch line to switch a destination of the processing liquid, and
wherein the second branch line includes a second heating mechanism, a second filter, and a second drain line configured to drain the processing liquid flowing through the second branch line, which are arranged sequentially from an upstream side, the second branch line further including a second branch circulation line branching from between the second heating mechanism and the second filter to return the processing liquid sent from the tank to the tank, and including a second valve provided between the second drain line and the second branch line to switch a destination of the processing liquid.

2. The liquid supply device of claim 1, further comprising:
a controller,
wherein the controller controls the pump, the first heating mechanism, and the second heating mechanism to heat the processing liquid while allowing the processing liquid to flow through the first branch circulation line and the second branch circulation line.

3. The liquid supply device of claim 2, wherein the controller controls the pump, the first valve, and the second valve to send the processing liquid circulating in the first branch circulation line and the second branch circulation line to the first filter and the second filter, and to drain the processing liquid passed through the first filter and the second filter into the first drain line and the second drain line.

4. The liquid supply device of claim 2, further comprising:
a first flowmeter arranged between the first heating mechanism and the first branch circulation line;
a second flowmeter arranged between the second heating mechanism and the second branch circulation line;
a third valve configured to switch the destination of the processing liquid in the first branch line between the first branch circulation line and the first filter; and
a fourth valve configured to switch the destination of the processing liquid in the second branch line between the second branch circulation line and the second filter,
wherein after each of a measurement value obtained by the first flowmeter and a measurement value obtained by the second flowmeter falls within a threshold range, the controller controls the third valve to switch the destination of the processing liquid in the first branch line from the first branch circulation line to the first filter, and controls the fourth valve to switch the destination of the processing liquid in the second branch line from the second branch circulation line to the second filter.

5. The liquid supply device of claim 2, wherein the controller starts to send the processing liquid to the first branch circulation line, and subsequently, starts to send the processing liquid to the second branch circulation line.

6. The liquid supply device of claim 3, wherein after the processing liquid is drained from the first drain line and the second drain line, the controller controls the first valve and the second valve to send the processing liquid to the first branch line and the second branch line and to return the processing liquid to the tank.

7. A liquid supply method performed in the liquid supply device of claim 1, the liquid supply method comprising:
heating the processing liquid while circulating the processing liquid in the first branch circulation line; and
heating the processing liquid while circulating the processing liquid in the second branch circulation line.

8. The liquid supply method of claim 7, further comprising:
sending the processing liquid circulating in the first branch circulation line to the first filter, and draining the processing liquid passed through the first filter into the first drain line; and
sending the processing liquid circulating in the second branch circulation line to the second filter, and draining the processing liquid passed through the second filter into the second drain line.

9. A non-transitory computer-readable storage medium storing a program that operates on a computer and controls a liquid supply device,
wherein the program, when executed, causes the computer to control the liquid supply device so as to perform the liquid supply method of claim 7.

10. A non-transitory computer-readable storage medium storing a program that operates on a computer and controls a liquid supply device, wherein the program, when executed, causes the computer to control the liquid supply device so as to perform the liquid supply method of claim 8.

\* \* \* \* \*